US010855224B2

(12) United States Patent
Kalia et al.

(10) Patent No.: US 10,855,224 B2
(45) Date of Patent: Dec. 1, 2020

(54) MAGNETICALLY DECOUPLED CONCENTRIC COILS STRUCTURE FOR AREA OPTIMIZED HIGH PERFORMANCE LC VCOS

(71) Applicant: Intel Corporation, Santa Clara, CA (US)

(72) Inventors: Sachin Kalia, Hillsboro, OR (US); Satwik Patnaik, Portland, OR (US); Hyung-Jin Lee, Portland, OR (US); Ram Sadhwani, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/369,361

(22) Filed: Mar. 29, 2019

(65) Prior Publication Data

US 2020/0313615 A1    Oct. 1, 2020

(51) Int. Cl.
*H03B 5/12* (2006.01)

(52) U.S. Cl.
CPC ........... *H03B 5/1228* (2013.01); *H03B 5/125* (2013.01); *H03B 5/1215* (2013.01); *H03B 5/1243* (2013.01); *H03B 2201/0266* (2013.01)

(58) Field of Classification Search
CPC .................................................. H03B 5/1228
USPC ......................................................... 331/167
See application file for complete search history.

(56) References Cited

U.S. PATENT DOCUMENTS 7,609,120 B2    10/2009  Chung et al.
9,490,745 B1 *  11/2016  Toso ..................... H03B 5/1212
9,667,193 B2     5/2017  Chakraborty
2003/0227336 A1 12/2003  Wang et al.
2008/0266005 A1* 10/2008  Jacobsson .............. H03B 5/124
                                                           331/108 A
2008/0309435 A1* 12/2008  Wu ....................... H03B 5/1215
                                                            333/204
2017/0201223 A1  7/2017  Aboush

OTHER PUBLICATIONS

Hegazi, Emad et al. "A Filtering Technique to Lower LC Oscillator Phase Noise." IEEE Journal of Solid-State Circuits, vol. 36, No. 12, Dec. 2001. 11 pages.

* cited by examiner

*Primary Examiner* — Joseph Chang
(74) *Attorney, Agent, or Firm* — 2SPL Patent Attorneys PartG mbB; Yong Beom Hwang

(57) ABSTRACT

A voltage controlled oscillator (VCO) circuit is disclosed. The VCO circuit comprises a VCO tuning circuit comprising a primary inductive coil. In some embodiments, the VCO tuning circuit is configured to generate a VCO output signal at a first resonance frequency. The VCO circuit further comprises a filter circuit comprising a secondary inductive coil. In some embodiments, the filter circuit is configured to resonate at a second, different, resonance frequency, in order to filter a noise associated with the VCO tuning circuit. In some embodiments, the primary inductive coil associated with the VCO tuning circuit and the secondary inductive coil associated with the filter circuit are concentrically arranged with respect to one another. Further, in some embodiments, the primary inductive coil associated with the VCO tuning circuit and the secondary inductive coil associated with the filter circuit are magnetically decoupled with respect to one another.

21 Claims, 11 Drawing Sheets

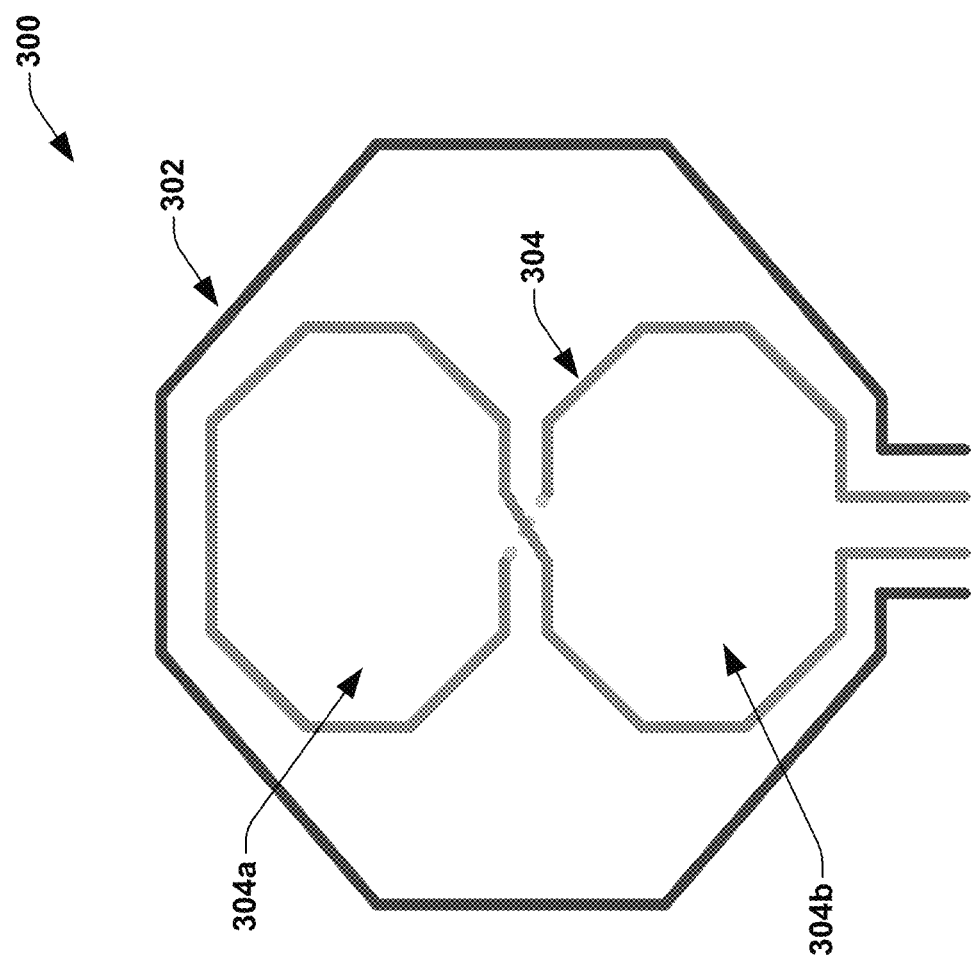

MAGNETICALLY DECOUPLED CONCENTRIC COILS STRUCTURE FOR AREA OPTIMIZED HIGH PERFORMANCE LC VCOS

FIELD

The present disclosure relates to voltage controlled oscillators (VCOs), and in particular, to an architecture for area optimized high performance VCOs.

BACKGROUND

Recent advances in wireless and wired connectivity standards such as Ethernet, cellular etc. impose more and more stringent noise requirements on transmitters and receivers in order to achieve the increasing data rates in these standards. Low phase noise frequency synthesizers are essential to minimize bit error for high data rates as well as meet the coexistence requirements. Low phase noise voltage controlled oscillators (VCOs) form an integral part of every low phase noise frequency synthesizer (e.g., phase locked loop (PLL)). While VCOs can be made using just capacitors and active devices (complementary metal oxide semiconductor (CMOS) ring VCO), high performance VCOs exclusively employ inductors (L) and capacitors (C) for frequency generation. The filtering action from the high quality factor LC tank significantly lowers the VCO phase noise. But this noise improvement comes at an area penalty as the inductor usually occupies 60 to 70% of the overall VCO area. Carrier aggregation for modern cellular communication standards such as LTE as well as single chip solutions serving multiple frequency bands necessitate the use of multiple VCOs within a single PLL or multiple PLLs (one per band).

BRIEF DESCRIPTION OF THE DRAWINGS

Some examples of circuits, apparatuses and/or methods will be described in the following by way of example only. In this context, reference will be made to the accompanying Figures.

FIGS. 3a-3c illustrates an example arrangement of a primary inductive coil and a secondary inductive coil associated with a VCO circuit, according to one embodiment of the disclosure.

DETAILED DESCRIPTION

Figure 1:
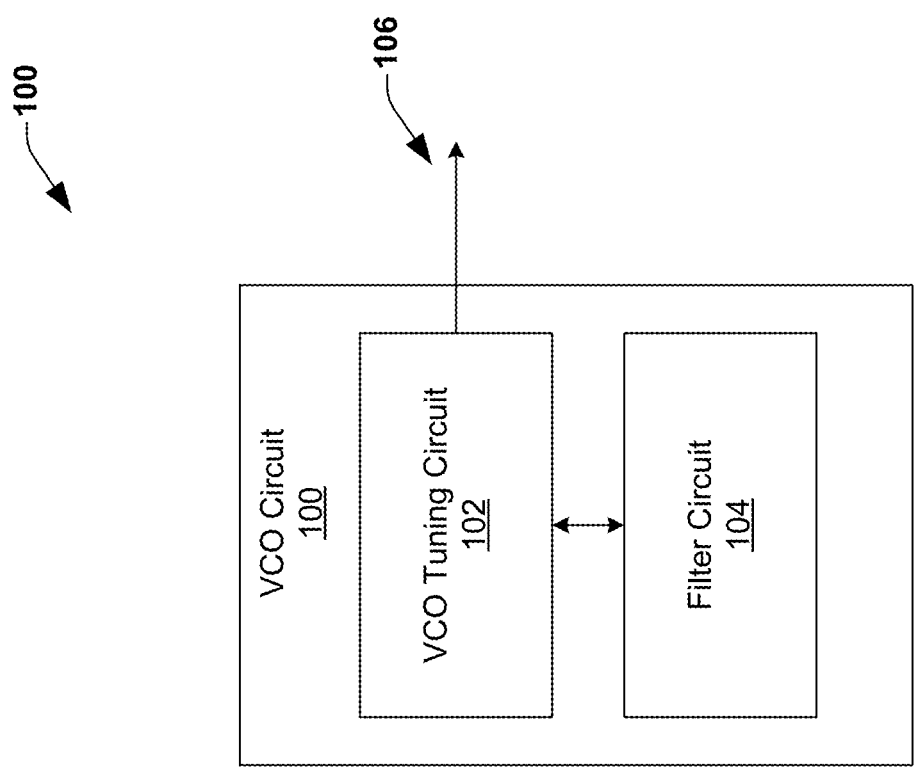
FIG. 1 illustrates a simplified block diagram of an exemplary voltage controlled oscillator (VCO) circuit, according to one embodiment of the disclosure.

In one embodiment of the disclosure, a voltage controlled oscillator (VCO) circuit is disclosed. The VCO circuit comprises a VCO tuning circuit comprising a primary inductive coil. In some embodiments, the VCO tuning circuit is configured to generate a VCO output signal at a first resonance frequency. In some embodiments, the VCO circuit further comprises a filter circuit comprising a secondary inductive coil. In some embodiments, the filter circuit is coupled to the VCO tuning circuit and the filter circuit is configured to resonate at a second, different, resonance frequency, in order to filter a noise associated with the VCO tuning circuit. In some embodiments, the primary inductive coil associated with the VCO tuning circuit and the secondary inductive coil associated with the filter circuit are concentrically arranged with respect to one another. Further, in some embodiments, the primary inductive coil associated with the VCO tuning circuit and the secondary inductive coil associated with the filter circuit are magnetically decoupled with respect to one another. In some embodiments, the primary inductive coil associated with the VCO tuning circuit and the secondary inductive coil associated with the filter circuit are required to be magnetically decoupled with respect to one another, in order to improve phase noise performance.

In one embodiment of the disclosure, a voltage controlled oscillator (VCO) circuit is disclosed. The VCO circuit comprises a VCO tuning circuit comprising a primary inductive coil. In some embodiments, the VCO tuning circuit is configured to generate a VCO output signal at a first resonance frequency. In some embodiments, the VCO circuit further comprises a second harmonic filter circuit comprising a secondary inductive coil. In some embodiments, the second harmonic filter circuit is coupled to the VCO tuning circuit and the second harmonic filter circuit is configured to resonate at a second, different, resonance frequency, in order to filter a common mode noise associated with the VCO tuning circuit. In some embodiments, the second resonance frequency comprises a frequency that is a second harmonic of the first resonance frequency. In some embodiments, the primary inductive coil associated with the VCO tuning circuit and the secondary inductive coil associated with the second harmonic filter circuit are concentrically arranged with respect to one another. Further, in some embodiments, the primary inductive coil associated with the VCO tuning circuit and the secondary inductive coil associated with the second harmonic filter circuit are magnetically decoupled with respect to one another.

In one embodiment of the disclosure, a method for a voltage controlled oscillator (VCO) circuit is disclosed. The method comprises generating a VCO output signal at a first resonance frequency at a VCO tuning circuit. In some embodiments, VCO tuning circuit comprises a primary inductive coil. In some embodiments, the method further comprises filtering a common mode noise associated with the VCO tuning circuit at a filter circuit. In some embodiments, the filter circuit comprises a secondary inductive coil and the filter circuit is configured to resonate at a second, different, resonance frequency. In some embodiments, the primary inductive coil associated with the VCO tuning circuit and the secondary inductive coil associated with the filter circuit are concentrically arranged with respect to one another. Further, in some embodiments, the primary inductive coil associated with the VCO tuning circuit and the secondary inductive coil associated with the filter circuit are magnetically decoupled with respect to one another.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from conte8, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from conte8 to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, high performance LC VCOs occupies a large area due to the presence of inductors. In particular, the LC VCOs comprises a primary LC tank circuit comprising a primary inductive coil that provides frequency tuning and noise filtering. Additionally, most high performance (low phase noise) LC VCO solutions use multiple inductors. In particular, the high performance VCOs utilize a $2^{nd}$ harmonic filter comprising a secondary LC tank circuit that comprises a secondary inductive coil for common mode noise filtering. In some embodiments, the $2^{nd}$ harmonic filter prevents flicker noise up-conversion by presenting a high common mode impedance at a differential node in the LC VCO. In some embodiments, the common mode resonance through this additional inductor is tuned to be at twice the resonance frequency of the primary LC tank circuit. This common mode resonance improves the phase noise by filtering the noise from the tail current source, (or any amplitude control impedance) around the second harmonic of the oscillation frequency. Even in the absence of a tail current source (or an amplitude control impedance) common mode resonance improves phase noise by 1) allowing the common mode node to swing below ground potential leading to higher voltage swings and 2) reducing the de-Qing of the LC tank by lowering the time spent by active devices in triode region.

All of these benefits come at an area penalty associated with the second inductor (associated with the $2^{nd}$ harmonic filter). Moreover, symmetry of the active devices, capacitor bank and primary inductor (associated with the primary LC tank circuit) with respect to each other take precedence forcing this second inductor to be positioned asymmetrically with respect to these components. The $2^{nd}$ harmonic filter is a standard feature in low phase noise VCOs but all existing solutions are area hungry and asymmetric by design which affects the VCO noise performance aside from the area penalty. In particular, in current implementations of high performance LC VCOs, the secondary inductive coil associated with the $2^{nd}$ harmonic filter resides in a physically separate and unshared space with respect to the primary inductive coil of the primary LC tank of the VCO, leading to area wastage as well as asymmetry by design.

In order to overcome the above disadvantages, a novel architecture for a VCO circuit is proposed in this disclosure. In particular, a VCO circuit wherein a primary inductive coil associated with a primary LC tank circuit and a secondary inductive coil associated with a secondary tank circuit are arranged in a concentric magnetically decoupled arrangement is proposed herein. In some embodiments, the proposed arrangement allows for area savings as well as ensures near perfect symmetry of the secondary inductive coil with respect to the primary inductive coil there by leading to a better flicker noise performance. Further, in some embodiments, the cohabitation of the two coils ensures environmental localization of the secondary inductive coil for EM (electromagnetic) simulations as opposed to the tail coil lying outside the main coil and being susceptible to secondary coupling through other traces not accounted for in the EM model.

FIG. 1 illustrates a simplified block diagram of an exemplary voltage controlled oscillator (VCO) circuit 100, according to one embodiment of the disclosure. In some embodiments, the VCO circuit 100 may be included within frequency synthesizer circuits, for example, phase locked loops (PLLs). In some embodiments, the VCO circuit 100 may be included in radio frequency (RF) circuits. In some embodiments, the VCO circuit 100 comprises a VCO tuning circuit 102 and a filter circuit 104. In some embodiments, the VCO tuning circuit 102 is configured to generate a VCO output signal 106 at a first resonance frequency, say, $f_1$. In some embodiments, the VCO output signal 106 comprises a differential signal. In some embodiments, the first resonance frequency comprises a predefined frequency. Alternately, in other embodiments, the first resonance frequency may comprise any frequency and is not predefined. In some embodiments, the filter circuit 104 is configured to resonate at a second, different, resonance frequency, say, $f_2$, in order to filter a noise associated with the VCO tuning circuit 102. In some embodiments, the noise comprises a common mode noise. In some embodiments, the filter circuit 104 enables to reduce the phase noise associated with the VCO tuning circuit 102, thereby improving the noise performance of the VCO tuning circuit 102. In some embodiments, the second resonance frequency comprises a frequency that is twice the first resonance frequency or a frequency that is a second harmonic of the first resonance frequency. In such embodiments, the filter circuit 104 comprises a $2^{nd}$ harmonic filter circuit. However, in other embodiments, the second resonance frequency may comprise an integer multiple of the first resonance frequency. Further, in some embodiments, the second resonance frequency may comprise any frequency that is different from the first resonance frequency. Furthermore, in some embodiments, the second resonance frequency may be predefined.

In some embodiments, the VCO tuning circuit 102 may comprise inductors and capacitors to generate the VCO output signal 106 at the first resonance frequency. In particular, in some embodiments, the VCO tuning circuit 102 comprises an LC tank circuit comprising an inductor and a capacitor arranged in parallel. In some embodiments, the inductor (or transformer, in some embodiments) associated with the VCO tuning circuit 102 is implemented as a primary inductive coil. In some embodiments, the primary inductive coil comprises an RF coil configured to operate in RF range. Similarly, in some embodiments, the filter circuit 104 may comprise inductors and capacitors that resonates at the second resonance frequency. In particular, in some embodiments, the filter circuit 104 comprises an LC tank circuit comprising an inductor and a capacitor arranged in parallel. In some embodiments, the inductor (or transformer, in some embodiments) associated with the filter circuit 104 is implemented as a secondary inductive coil. In some embodiments, the secondary inductive coil comprises an RF coil configured to operate in RF range. In some embodiments, the primary inductive coil associated with the VCO tuning circuit 102 and the secondary inductive coil associated with the filter circuit 104 are concentrically arranged with respect to one another. In some embodiments, the term concentrically arranged refers to having a common center point. In some embodiments, the primary inductive coil associated with the VCO tuning circuit 102 and the secondary inductive coil associated with the filter circuit 104 are symmetrically arranged with respect to a common axis that passes through the common center point. Further, in some embodiments, the primary inductive coil associated with the VCO tuning circuit 102 and the secondary inductive coil associated with the filter circuit 104 are magnetically decoupled with respect to one another, in spite of being localized physically. In some embodiments, the term magnetically decoupled utilized herein further infers that the primary inductive coil associated with the VCO tuning circuit 102 and the secondary inductive coil associated with the filter circuit 104 are inductively decoupled with respect to one another.

In some embodiments, at least one of the primary inductive coil and the secondary inductive coil is implemented as a magnetically inert coil, in order to magnetically decouple the primary inductive coil and the secondary inductive coil with respect to one another. In some embodiments, a magnetically inert coil comprises a coil having a magnetically decoupled structure. In some embodiments, a magnetically decoupled structure refers to a structure that is magnetically inert with respect to other coils/structures. In particular, in some embodiments, the magnetic fields associated with the magnetically inert coil are localized within the coil. In other words, the magnetic fields associated with the magnetically inert coil do not couple with other coils. Further, the magnetic fields associated with other coils do not couple to the magnetically inert coil. In some embodiments, a shape of the magnetically inert coil is configured to result in the magnetically decoupled structure, further details of which are provided in embodiments below. In some embodiments, the magnetically inert coil comprises an figure-eight shaped coil. Alternately, in some embodiments, the magnetically inert coil comprises a four-leaf clover shaped coil comprising four loops. In the embodiments throughout the disclosure, the four-leaf clover shaped coil is referred to as a clover shaped coil. However, in other embodiments, the magnetically inert coil may comprise any shape that results in a magnetically decoupled structure.

In some embodiments, the primary inductive coil comprises a regular differential coil and the secondary inductive coil comprises a magnetically inert coil. In the embodiments described throughout the disclosure, a regular differential coil refers to a differential coil that is different from a magnetically inert coil and wherein the regular differential coil does not have a magnetically decoupled structure. Further, in some embodiments, the primary inductive coil comprises a magnetically inert coil and the secondary inductive coil comprises a regular differential coil. However, in other embodiments, both the primary inductive coil and the secondary inductive coil may comprise magnetically inert coils. In other embodiments, however, the primary inductive coil and the secondary inductive coil may be magnetically decoupled with respect to one another based on other techniques, for example, by utilizing an RF shield. Further, other methods to magnetically decouple the primary inductive coil and the secondary inductive coil are also contemplated to be within the scope of this disclosure.

Figure 2:
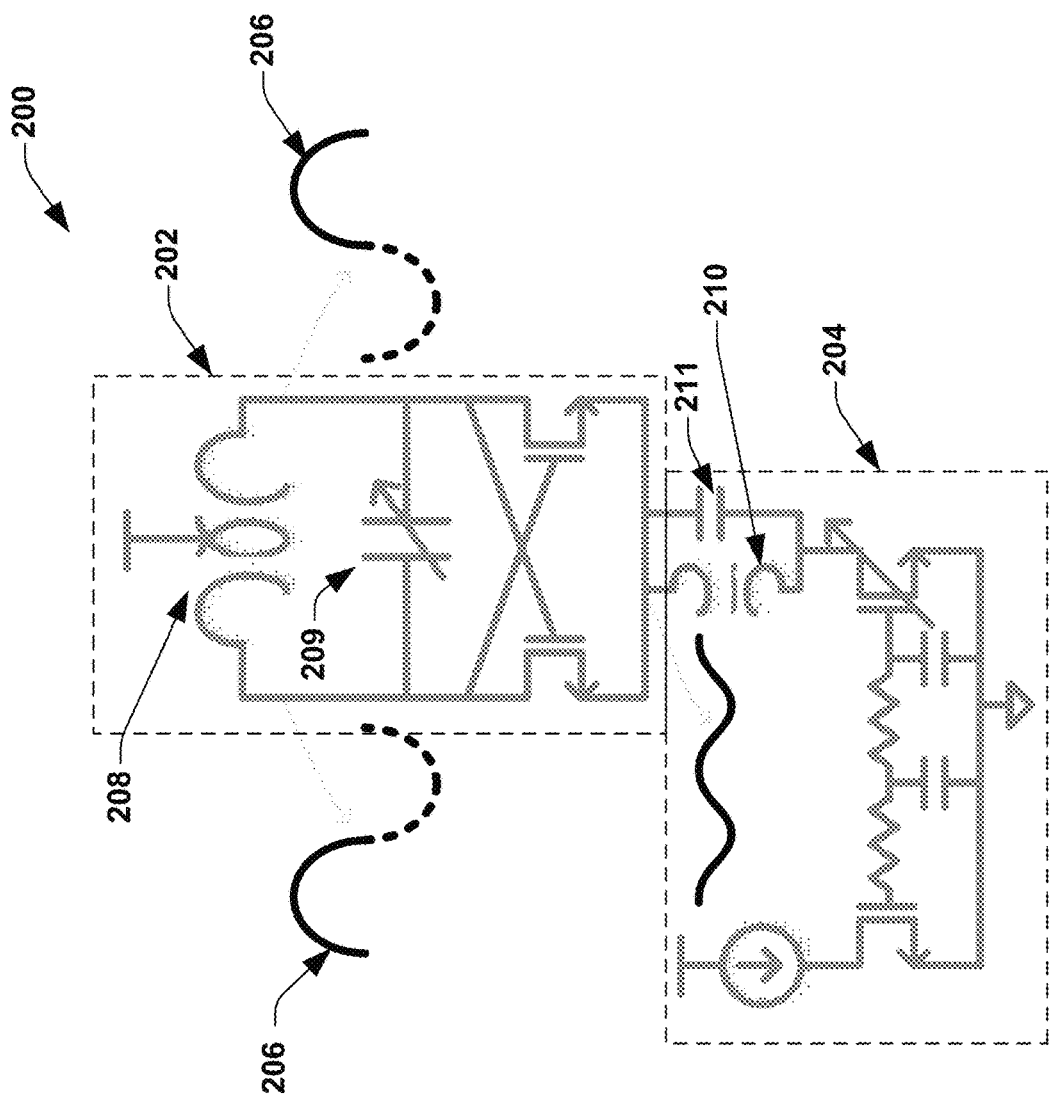
FIG. 2 illustrates an example implementation of a voltage controlled oscillator (VCO) circuit, according to one embodiment of the disclosure.

FIG. 2 illustrates an example implementation of an exemplary voltage controlled oscillator (VCO) circuit 200, according to one embodiment of the disclosure. In some embodiments, the VCO circuit 200 comprises one possible way of implementation of the VCO circuit 100 in FIG. 1. The VCO circuit 200 comprises a VCO tuning circuit 202 and a filter circuit 204. In some embodiments, the VCO tuning circuit 202 is configured to generate a VCO output signal 206 at a first resonance frequency, say, $f_1$. In some embodiments, the VCO output signal 206 comprises a differential signal. In some embodiments, the filter circuit 204 is coupled to the VCO tuning circuit 202 and the filter circuit 204 is configured to resonate at a second, different, resonance frequency, say, $f_2$, in order to filter a noise associated with the VCO tuning circuit 202. In some embodiments, the noise comprises a common mode noise. In some embodiments, the filter circuit 204 enables to reduce the phase noise associated with the VCO tuning circuit 202. In this embodiment, the second resonance frequency comprises a frequency that is twice the first resonance frequency or a frequency that is at a second harmonic of the first resonance frequency. Therefore, in this embodiment, the filter circuit 204 comprises a $2^{nd}$ harmonic filter circuit. However, in other embodiments, the second resonance frequency may comprise an integer multiple of the first resonance frequency. Furthermore, in some embodiments, the second resonance frequency may comprise any frequency that is different from the first resonance frequency.

In some embodiments, the VCO tuning circuit 202 comprises an LC tank circuit comprising an inductor 208 and a capacitor 209 arranged in parallel. In some embodiments, the inductor 208 (or transformer, in some embodiments) associated with the VCO tuning circuit 202 is implemented as a primary inductive coil. Similarly, in some embodiments, the filter circuit 204 comprises an LC tank circuit comprising an inductor 210 and a capacitor 211 arranged in parallel. In some embodiments, the inductor 210 (or transformer, in some embodiments) associated with the filter circuit 204 is implemented as a secondary inductive coil. In some embodiments, the inductance of the inductor 210 is smaller compared to the inductance of the inductor 208. Therefore, in some embodiments, the secondary inductive coil is smaller compared to the primary inductive coil. In some embodiments, the primary inductive coil associated with the VCO tuning circuit 202 and the secondary inductive coil associated with the filter circuit 204 are concentrically arranged with respect to one another. In some embodiments, the term concentrically arranged refers to having a common center point. In some embodiments, the primary inductive coil associated with the VCO tuning circuit 202 and the secondary inductive coil associated with the filter circuit 204 are symmetrically arranged with respect to a common axis that passes through the common center point. Further, in some embodiments, the primary inductive coil associated with the VCO tuning circuit 202 and the secondary inductive coil associated with the filter circuit 204 are magnetically decoupled with respect to one another.

In some embodiments, at least one of the primary inductive coil and the secondary inductive coil is implemented as a magnetically inert coil, in order to magnetically decouple the primary inductive coil and the secondary inductive coil with respect to one another. In some embodiments, a magnetically inert coil comprises a coil having a magnetically decoupled structure, as explained above with respect to FIG. 1. In some embodiments, a shape of the magnetically inert coil is configured to result in the magnetically decoupled structure, further details of which are provided in embodiments below. In some embodiments, the magnetically inert coil comprises an figure-eight shaped coil. Alternately, in some embodiments, the magnetically inert coil comprises a clover shaped coil. However, in other embodiments, the magnetically inert coil may comprise any shape that results in a magnetically decoupled structure. In some embodiments, the primary inductive coil comprises a regular differential coil and the secondary inductive coil comprises a magnetically inert coil, as explained in FIG. 3a and FIG. 4a below. Further, in some embodiments, the primary inductive coil comprises a magnetically inert coil and the secondary inductive coil comprises a regular differential coil, as explained in FIG. 5 and FIG. 6 below. However, in other embodiments, both the primary inductive coil and the secondary inductive coil may comprise magnetically inert coils.

FIG. 3a illustrates an example arrangement 300 of a primary inductive coil and a secondary inductive coil associated with a VCO circuit, according to one embodiment of the disclosure. In some embodiments, the arrangement 300 comprises one possible way of arrangement of the primary inductive coil and the secondary inductive coil associated with the VCO circuit 200 in FIG. 2 or the VCO circuit 100 in FIG. 1. Therefore, the arrangement 300 is explained herein with reference to the VCO circuit 200 in FIG. 2 and the VCO circuit 100 in FIG. 1. The arrangement 300 comprises a primary inductive coil 302 and a secondary inductive coil 304. In some embodiments, the primary inductive coil 302 is associated with a VCO tuning circuit (e.g., the VCO tuning circuit 102 in FIG. 1) associated with a VCO circuit (e.g., the VCO circuit 100 in FIG. 1). Further, the secondary inductive coil 304 is associated with a filter circuit (e.g., the filter circuit 104 in FIG. 1) associated with the VCO circuit.

Figure 3B:
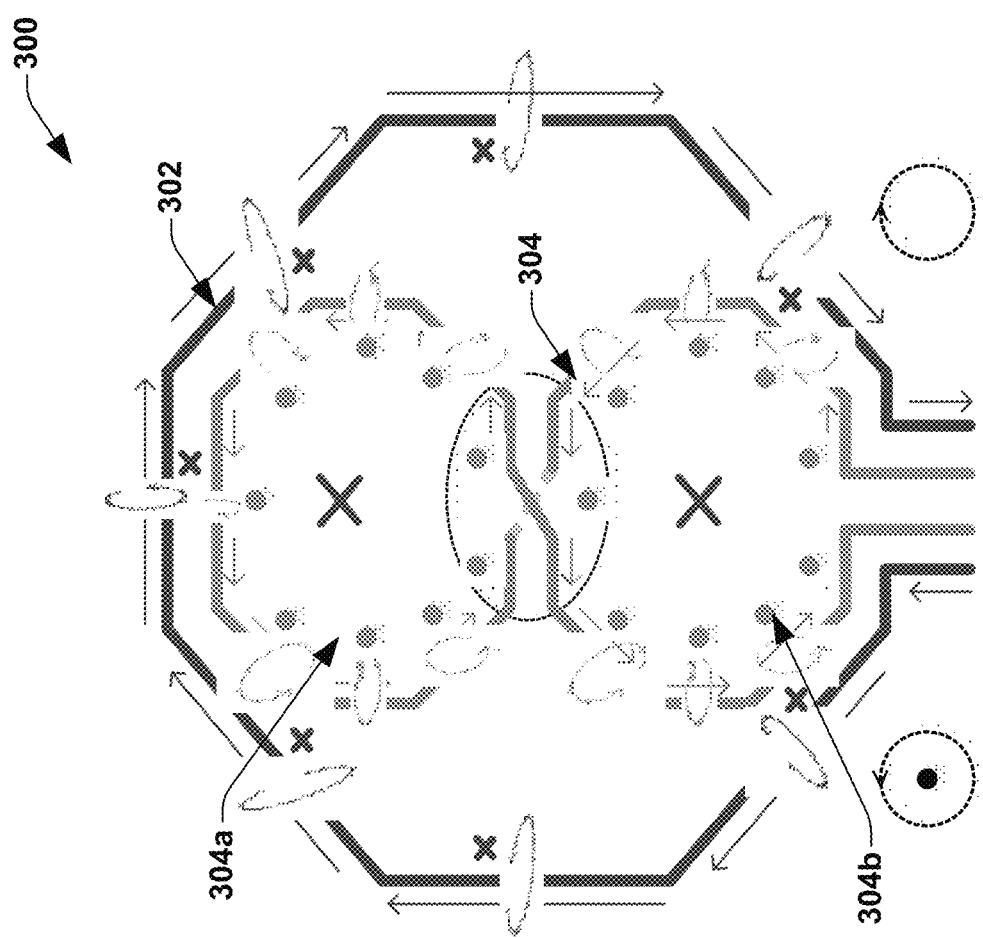

In this embodiment, the primary inductive coil 302 comprises a regular differential coil and the secondary inductive coil 304 comprises a magnetically inert coil. In this embodiment, the secondary inductive coil comprises a figure-eight shaped coil comprising two loops 304a and 304b. However, in other embodiments, the shape of the secondary inductive coil 304 may comprise any shape that results in a magnetically decoupled structure. Further, the primary inductive coil 302 and the secondary inductive coil 304 are concentrically arranged with respect to one another. In some embodiments, the primary inductive coil 302 and the secondary inductive coil 304 are symmetrically arranged with respect to a common axis that passes through a common center point associated with the primary inductive coil 302 and the secondary inductive coil 304. Furthermore, the primary inductive coil 302 and the secondary inductive coil 304 are magnetically decoupled with respect to one another. In some embodiments, the shape of the secondary inductive coil 304 (i.e., the figure-eight shape) results in the magnetic decoupling between the primary inductive coil 302 and the secondary inductive coil 304. In particular, as can be seen in FIG. 3b, due to the figure-eight shape of the secondary inductive coil 304, a current flowing through the primary inductive coil 302 causes an anti-parallel current flow in the two loops 304a and 304b associated with the secondary inductive coil 304. In some embodiments, the anti-parallel currents in the two loops 304a and 304b cancel each other. In some embodiments, the cancellation of the currents in the two loops magnetically decouples the secondary inductive coil 304 from the primary inductive coil 302.

Figure 3C:
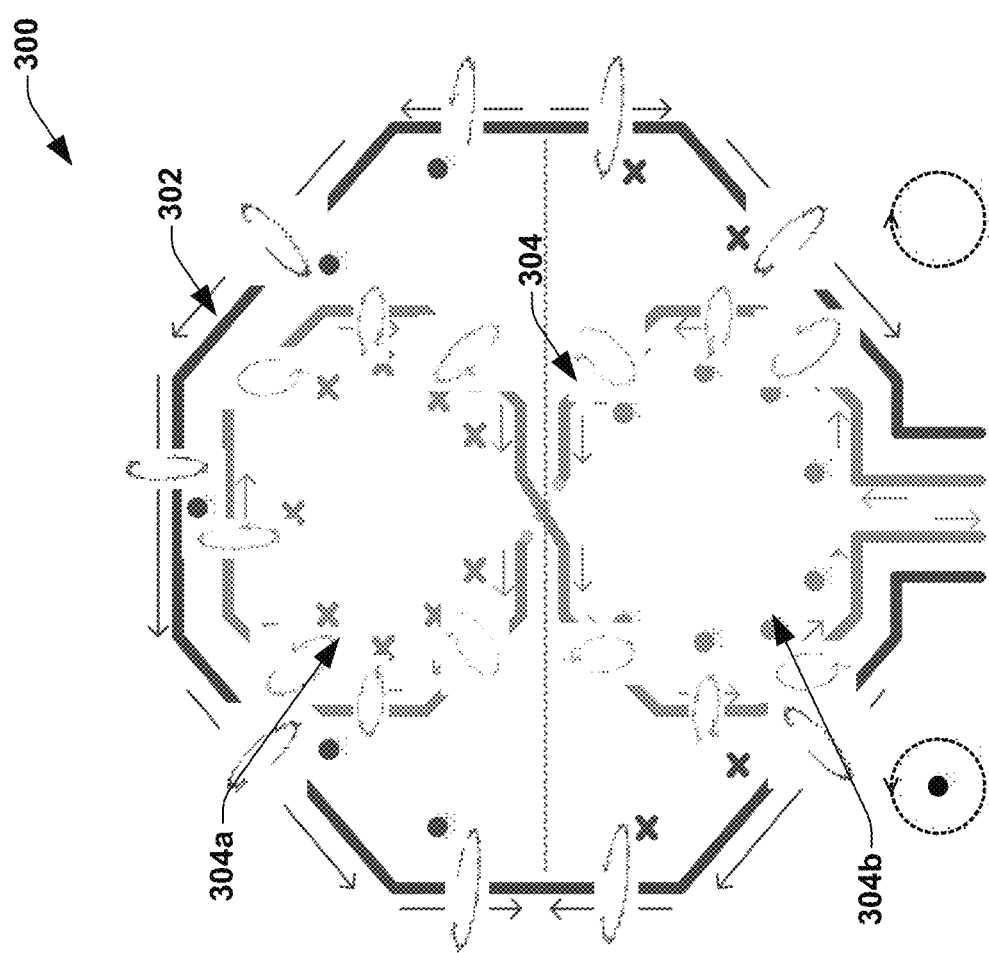

Further, as can be seen in FIG. 3c, due to the figure-eight shape of the secondary inductive coil 304, a current flowing through the secondary inductive coil 304 causes currents to get induced in opposite directions along different segments of the primary inductive coil 302, based on the proximity of the segment(s) to the secondary inductive coil 304. In particular, the current flowing in the top loop 304a of the secondary inductive coil 304 causes a current flow in the primary inductive coil 302 in one direction (i.e., anticlockwise) and the current flowing in the bottom loop 304b of the secondary inductive coil 304 causes a current flow in the primary inductive coil 302 in the opposite direction (i.e., clockwise). In some embodiments, the opposite currents in the primary inductive coil 302 cancel each other. In some embodiments, the cancellation of the currents in the primary inductive coil 302 decouples the primary inductive coil 302 from the secondary inductive coil 304. Therefore, in some embodiments, the figure-eight shape of the secondary inductive coil 304 results in a magnetically decoupled structure.

Figure 4A:
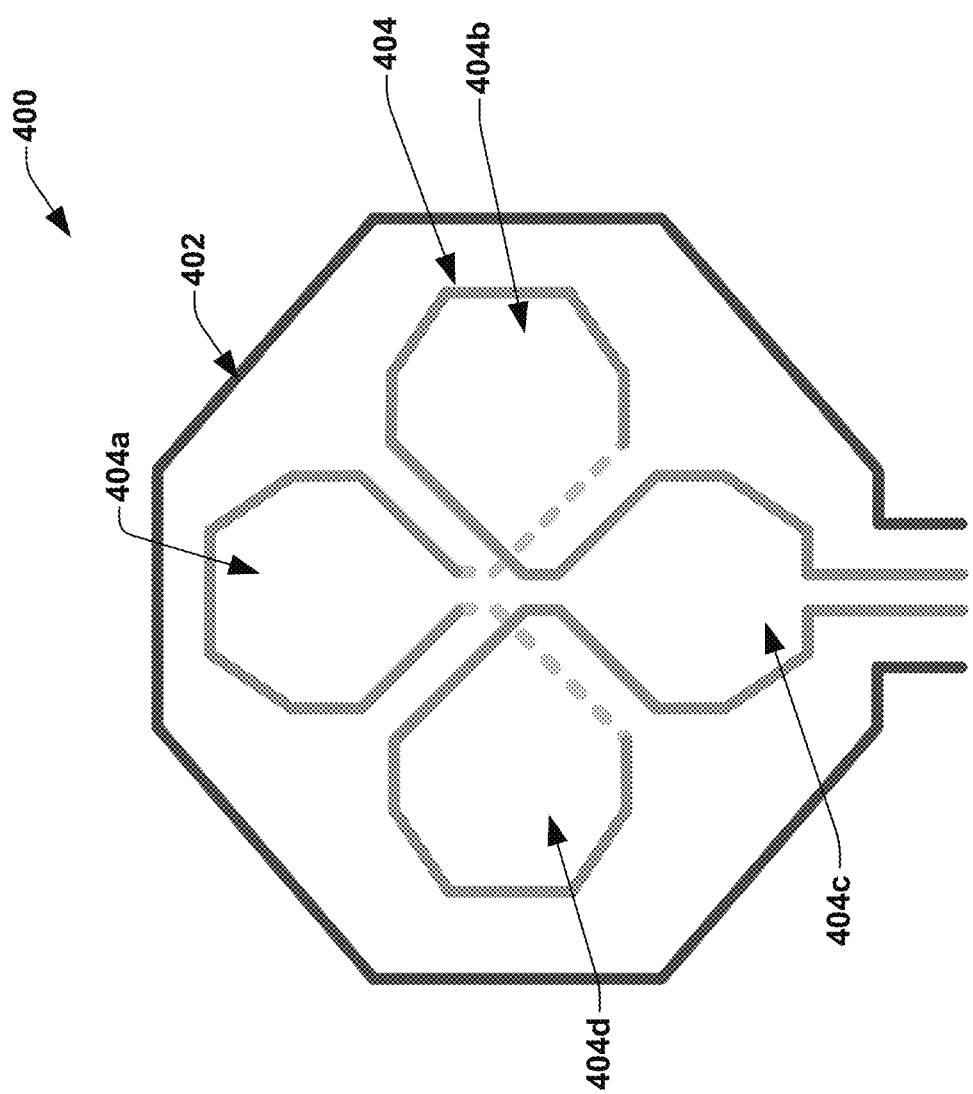
FIGS. 4a-4c illustrates another example arrangement of a primary inductive coil and a secondary inductive coil associated with a VCO circuit, according to one embodiment of the disclosure.

FIG. 4a illustrates another example arrangement 400 of a primary inductive coil and a secondary inductive coil associated with a VCO circuit, according to one embodiment of the disclosure. In some embodiments, the arrangement 400 comprises one possible way of arrangement of the primary inductive coil and the secondary inductive coil associated with the VCO circuit 200 in FIG. 2 or the VCO circuit 100 in FIG. 1. Therefore, the arrangement 400 is explained herein with reference to the VCO circuit 200 in FIG. 2 and the VCO circuit 100 in FIG. 1. The arrangement 400 comprises a primary inductive coil 402 and a secondary inductive coil 404. In some embodiments, the primary inductive coil 402 is associated with a VCO tuning circuit (e.g., the VCO tuning circuit 102 in FIG. 1) associated with a VCO circuit (e.g., the VCO circuit 100 in FIG. 1). Further, the secondary inductive coil 404 is associated with a filter circuit (e.g., the filter circuit 104 in FIG. 1) associated with the VCO circuit.

Figure 4B:
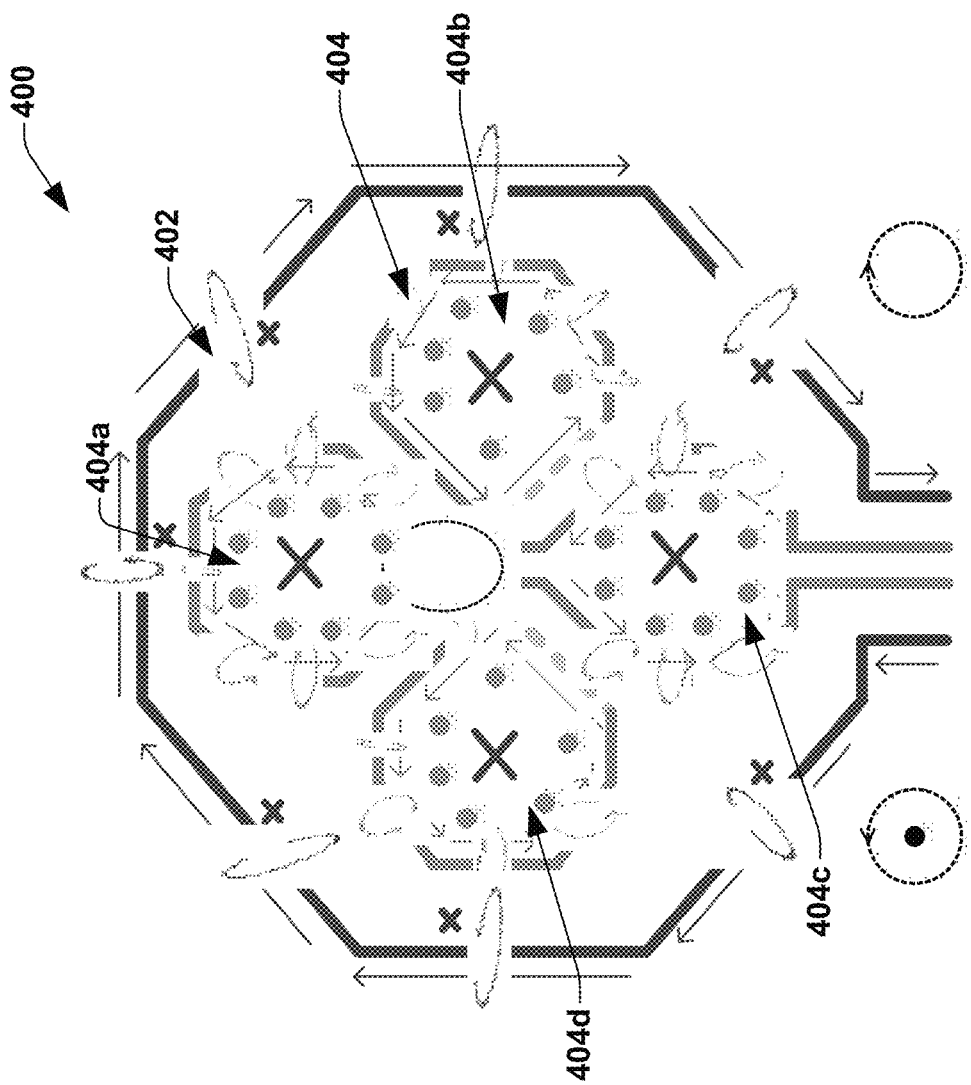

In this embodiment, the primary inductive coil 402 comprises a regular differential coil and the secondary inductive coil 404 comprises a magnetically inert coil. In this embodiment, the secondary inductive coil 404 comprises a clover shaped coil comprising four loops 404a, 404b, 404c and 404d. However, in other embodiments, the shape of the secondary inductive coil 404 may comprise any shape that results in a magnetically decoupled structure. Further, the primary inductive coil 402 and the secondary inductive coil 404 are concentrically arranged with respect to one another. In some embodiments, the primary inductive coil 402 and the secondary inductive coil 404 are symmetrically arranged with respect to a common axis that passes through a common center point associated with the primary inductive coil 402 and the secondary inductive coil 404. Furthermore, the primary inductive coil 402 and the secondary inductive coil 404 are magnetically decoupled with respect to one another. In some embodiments, the shape of the secondary inductive coil 404 (i.e., the clover shape) results in the magnetic decoupling between the primary inductive coil 402 and the secondary inductive coil 404. In particular, as can be seen in FIG. 4b, due to the clover shape of the secondary inductive coil 404, a current flowing through the primary inductive coil 402 causes opposing current flows in the loops 404a, 404b, 404c and 404d associated with the secondary inductive coil 404. In some embodiments, the opposing current flows in the loops 404a, 404b, 404c and 404d cancel each other. In some embodiments, the cancellation of the currents in the loops 404a, 404b, 404c and 404d magnetically decouples the secondary inductive coil 404 from the primary inductive coil 402.

Figure 4C:
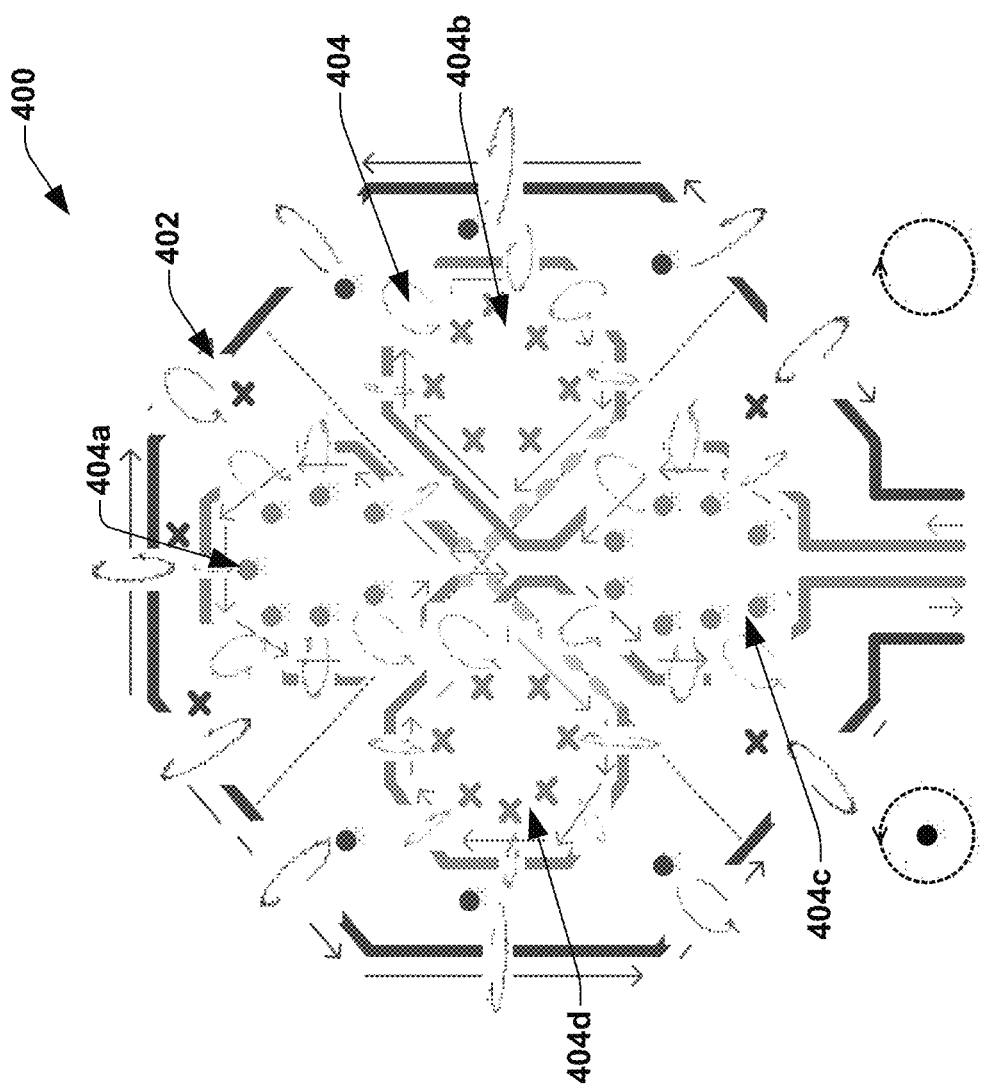

Further, as can be seen in FIG. 4c, due to the clover shape of the secondary inductive coil 404, a current flowing through the secondary inductive coil 404 causes currents to get induced in opposite directions along different segments of the primary inductive coil 402, based on the proximity of the segment(s) to the secondary inductive coil 404. In some embodiments, the opposite currents in the primary inductive coil 402 cancel each other. In some embodiments, the cancellation of the currents in the primary inductive coil 402 decouples the primary inductive coil 402 from the secondary inductive coil 404. Therefore, in some embodiments, the clover shape of the secondary inductive coil 404 results in a magnetically decoupled structure.

Figure 5:
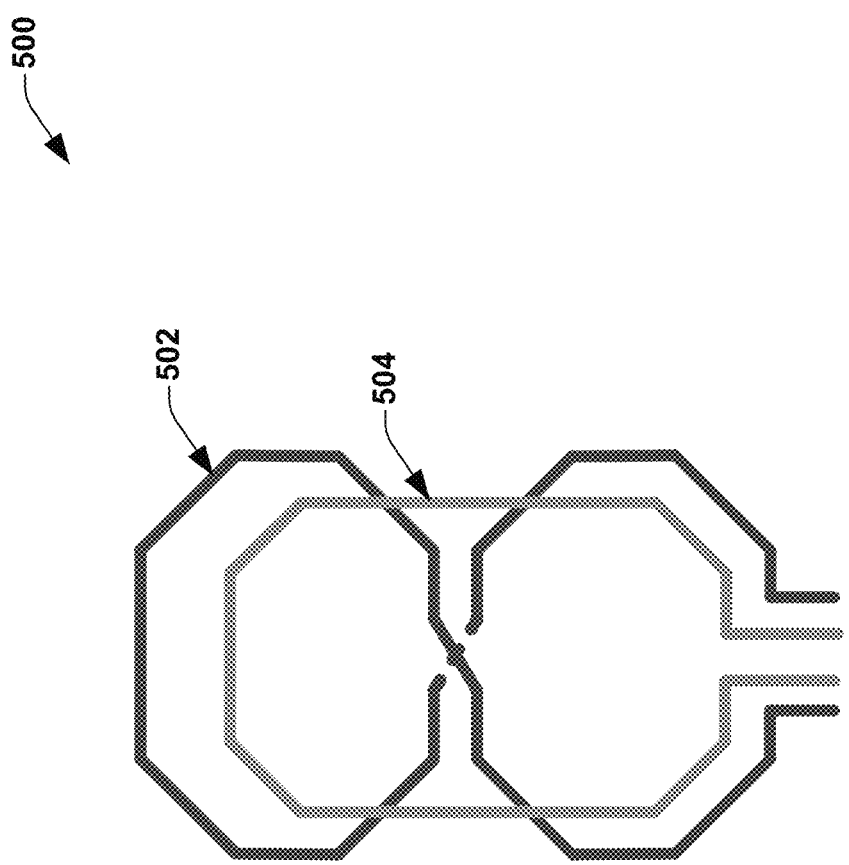
FIG. 5 illustrates another example arrangement of a primary inductive coil and a secondary inductive coil associated with a VCO circuit, according to one embodiment of the disclosure.

FIG. 5 illustrates another example arrangement 500 of a primary inductive coil and a secondary inductive coil associated with a VCO circuit, according to one embodiment of the disclosure. In some embodiments, the arrangement 500 comprises one possible way of arrangement of the primary inductive coil and the secondary inductive coil associated with the VCO circuit 200 in FIG. 2 or the VCO circuit 100 in FIG. 1. Therefore, the arrangement 500 is explained herein with reference to the VCO circuit 200 in FIG. 2 and the VCO circuit 100 in FIG. 1. The arrangement 500 comprises a primary inductive coil 502 and a secondary inductive coil 504. In some embodiments, the primary inductive coil 502 is associated with a VCO tuning circuit (e.g., the VCO tuning circuit 102 in FIG. 1) associated with a VCO circuit (e.g., the VCO circuit 100 in FIG. 1). Further, the secondary inductive coil 504 is associated with a filter circuit (e.g., the filter circuit 104 in FIG. 1) associated with the VCO circuit.

In this embodiment, the primary inductive coil 502 comprises a magnetically inert coil and the secondary inductive coil 504 comprises a regular differential coil. In this embodiment, the primary inductive coil 502 comprises a figure-eight shaped coil. However, in other embodiments, the shape of the primary inductive coil 502 may comprise any shape that results in a magnetically decoupled structure. In some embodiments, the primary inductive coil 502 and the secondary inductive coil 504 are concentrically arranged with respect to one another. In some embodiments, the primary inductive coil 502 and the secondary inductive coil 504 are symmetrically arranged with respect to a common axis that passes through a common center point associated with the primary inductive coil 502 and the secondary inductive coil 504. Further, the primary inductive coil 502 and the secondary inductive coil 504 are magnetically decoupled with respect to one another. In some embodiments, the shape of the primary inductive coil 502 (i.e., the figure-eight shape) results in the magnetic decoupling between the primary inductive coil 502 and the secondary inductive coil 504, as explained above with respect to FIGS. 3a-3c.

Figure 6:
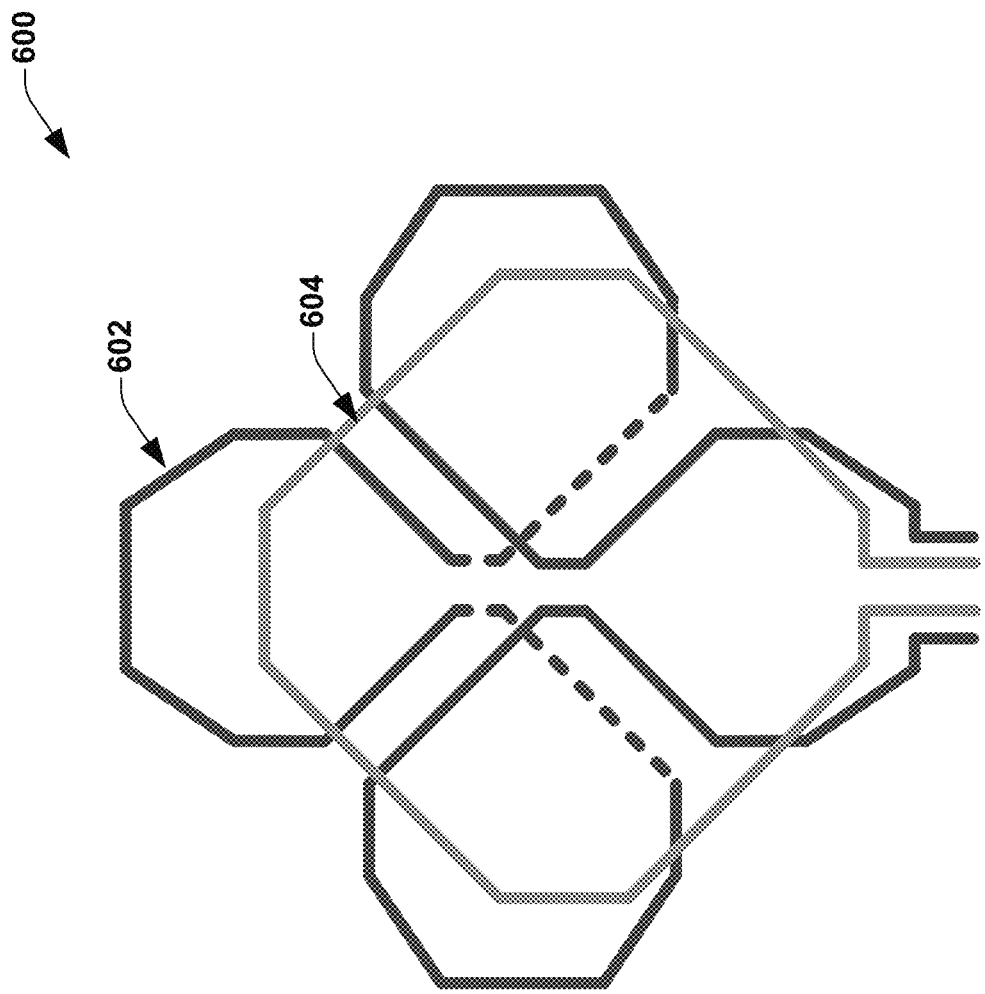
FIG. 6 illustrates a yet another example arrangement of a primary inductive coil and a secondary inductive coil associated with a VCO circuit, according to one embodiment of the disclosure.

FIG. 6 illustrates another example arrangement 600 of a primary inductive coil and a secondary inductive coil associated with a VCO circuit, according to one embodiment of the disclosure. In some embodiments, the arrangement 600 comprises one possible way of arrangement of the primary inductive coil and the secondary inductive coil associated with the VCO circuit 200 in FIG. 2 or the VCO circuit 100 in FIG. 1. Therefore, the arrangement 600 is explained herein with reference to the VCO circuit 200 in FIG. 2 and the VCO circuit 100 in FIG. 1. The arrangement 600 comprises a primary inductive coil 602 and a secondary inductive coil 604. In some embodiments, the primary inductive coil 602 is associated with a VCO tuning circuit (e.g., the VCO tuning circuit 102 in FIG. 1) associated with a VCO circuit (e.g., the VCO circuit 100 in FIG. 1). Further, the secondary inductive coil 604 is associated with a filter circuit (e.g., the filter circuit 104 in FIG. 1) associated with the VCO circuit.

In this embodiment, the primary inductive coil 602 comprises a magnetically inert coil and the secondary inductive coil 604 comprises a regular differential coil. In this embodiment, the primary inductive coil 602 comprises a clover shaped coil. However, in other embodiments, the shape of the primary inductive coil 602 may comprise any shape that results in a magnetically decoupled structure. Further, the primary inductive coil 602 and the secondary inductive coil 604 are concentrically arranged with respect to one another. In some embodiments, the primary inductive coil 602 and the secondary inductive coil 604 are symmetrically arranged with respect to a common axis that passes through a common center point associated with the primary inductive coil 602 and the secondary inductive coil 604. Furthermore, the primary inductive coil 602 and the secondary inductive coil 604 are magnetically decoupled with respect to one another. In some embodiments, the shape of the primary inductive coil 602 (i.e., the clover shape) results in the magnetic decoupling between the primary inductive coil 602 and the secondary inductive coil 604, as explained above with respect to FIGS. 4a-4c.

Figure 7:
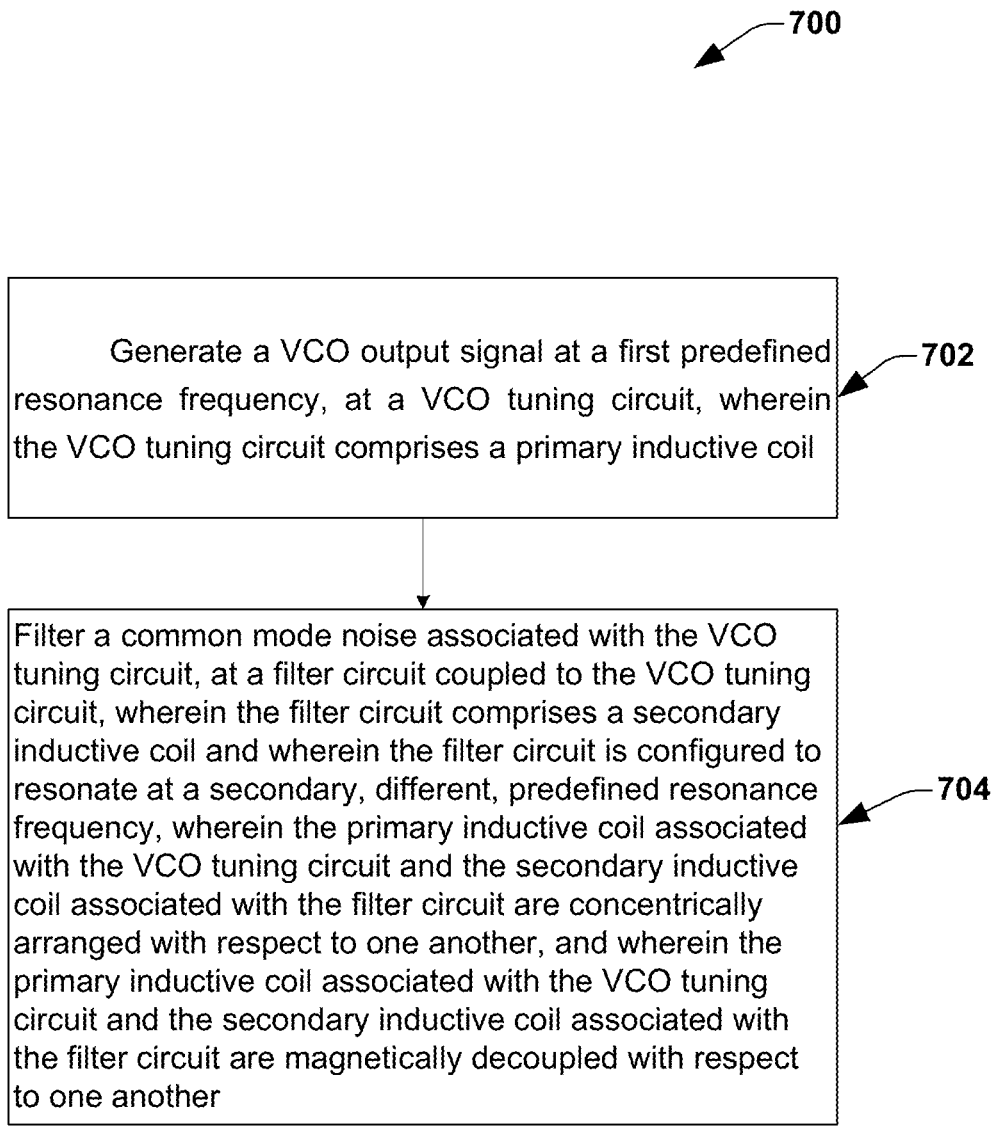
FIG. 7 illustrates a flow chart of a method for a voltage controlled oscillator (VCO) circuit, according to one embodiment of the disclosure.

FIG. 7 illustrates a flow chart of a method 700 for a voltage controlled oscillator (VCO) circuit, according to one embodiment of the disclosure. The method 700 is explained herein with reference to the VCO circuit 100 in FIG. 1 and the VCO circuit 200 in FIG. 2. At 702, a VCO output signal (e.g., the VCO output signal 106 in FIG. 1) at a first resonance frequency is generated at a VCO tuning circuit (e.g., the VCO tuning circuit 102 in FIG. 1). In some embodiments, the VCO tuning circuit comprises a primary inductive coil (e.g., the primary inductive coil 208 in FIG. 2). At 704, a noise (e.g., a common mode noise) associated with the VCO tuning circuit is filtered at a filter circuit (e.g., the filter circuit 104 in FIG. 1) coupled to the VCO tuning circuit. In some embodiments, the filter circuit comprises a secondary inductive coil (e.g., the secondary inductive coil 210 in FIG. 2). In some embodiments, the filter circuit is configured to resonate at a second, different, resonance frequency. In some embodiments, the second resonance frequency comprises a frequency that is a second harmonic of the first resonance frequency.

In some embodiments, the primary inductive coil associated with the VCO tuning circuit and the secondary inductive coil associated with the filter circuit are concentrically arranged with respect to one another. In some embodiments, the primary inductive coil and the secondary inductive coil are symmetrically arranged with respect to a common axis that passes through a common center point associated with the primary inductive coil and the secondary inductive coil. Further, in some embodiments, the primary inductive coil associated with the VCO tuning circuit and the secondary inductive coil associated with the filter circuit are magnetically decoupled with respect to one another. In some embodiments, at least one of the primary inductive coil and the secondary inductive coil is implemented as a magnetically inert coil, in order to magnetically decouple the primary inductive coil and the secondary inductive coil with respect to one another. In some embodiments, the magnetically inert coil comprises a coil having a magnetically decoupled structure, as explained above with respect to FIG. 1.

In some embodiments, the magnetically inert coil comprises a figure-eight shaped coil, as explained above with respect to FIG. 3a and FIG. 5. Alternately, in some embodiments, the magnetically inert coil comprises a clover shaped coil, as explained above with respect to FIG. 4a and FIG. 6. However, in other embodiments, the magnetically inert coil may comprise any shape that results in a magnetically decoupled structure. In some embodiments, the primary inductive coil comprises a regular differential coil and the secondary inductive coil comprises a magnetically inert coil, as explained above with respect to FIG. 3a and FIG. 4a. Further, in some embodiments, the primary inductive coil comprises a magnetically inert coil and the secondary inductive coil comprises a regular differential coil, as explained above with respect to FIG. 5 and FIG. 6. However, in other embodiments, both the primary inductive coil and the secondary inductive coil may comprise magnetically inert coils.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a voltage controlled oscillator (VCO) circuit, comprising a VCO tuning circuit comprising a primary inductive coil, wherein the VCO tuning circuit is configured to generate a VCO output signal at a first resonance frequency; and a filter circuit comprising a secondary inductive coil, wherein the filter circuit is coupled to the VCO tuning circuit and wherein the filter circuit is configured to resonate at a second, different, resonance frequency, in order to filter a noise associated with the VCO tuning circuit; wherein the primary inductive coil associated with the VCO tuning circuit and the secondary inductive coil associated with the filter circuit are concentrically arranged with respect to one another, and wherein the primary inductive coil associated with the VCO tuning circuit and the secondary inductive coil associated with the filter circuit are magnetically decoupled with respect to one another.

Example 2 is a VCO circuit, including the subject matter of example 1, wherein the second resonance frequency comprises a frequency that is twice the first resonance frequency.

Example 3 is a VCO circuit, including the subject matter of examples 1-2, including or omitting elements, wherein the second resonance frequency comprises a frequency that is an integer multiple of the first resonance frequency.

Example 4 is a VCO circuit, including the subject matter of examples 1-3, including or omitting elements, wherein at least one of the primary inductive coil and the secondary inductive coil is implemented as a magnetically inert coil, in order to magnetically decouple the primary inductive coil and the secondary inductive coil with respect to one another, wherein the magnetically inert coil comprises a coil having a magnetically decoupled structure.

Example 5 is a VCO circuit, including the subject matter of examples 1-4, including or omitting elements, wherein the magnetically inert coil comprises a figure-eight shaped coil.

Example 6 is a VCO circuit, including the subject matter of examples 1-5, including or omitting elements, wherein the magnetically inert coil comprises a clover shaped coil.

Example 7 is a VCO circuit, including the subject matter of examples 1-6, including or omitting elements, wherein the primary inductive coil comprises a regular differential coil and wherein the secondary inductive coil comprises a magnetically inert coil.

Example 8 is a VCO circuit, including the subject matter of examples 1-7, including or omitting elements, wherein the primary inductive coil comprises a magnetically inert coil and wherein the secondary inductive coil comprises a regular differential coil.

Example 9 is a VCO circuit, including the subject matter of examples 1-8, including or omitting elements, wherein both the primary inductive coil and the secondary inductive coil comprise magnetically inert coils.

Example 10 is a VCO circuit, including the subject matter of examples 1-9, including or omitting elements, wherein the primary inductive coil and the secondary inductive coil are symmetrically arranged with respect to a common axis that passes through a common center point associated with the primary inductive coil and the secondary inductive coil.

Example 11 is a VCO circuit, including the subject matter of examples 1-10, including or omitting elements, wherein the noise comprises common mode noise.

Example 12 is a voltage controlled oscillator (VCO) circuit, comprising a VCO tuning circuit comprising a primary inductive coil, wherein the VCO tuning circuit is configured to generate a VCO output signal at a first resonance frequency; and a second harmonic filter circuit comprising a secondary inductive coil, wherein the second harmonic filter circuit is coupled to the VCO tuning circuit and wherein the second harmonic filter circuit is configured to resonate at a frequency that is a second harmonic of the first resonance frequency, in order to filter a common mode noise associated with the VCO tuning circuit; wherein the primary inductive coil associated with the VCO tuning circuit and the secondary inductive coil associated with the second harmonic filter circuit are concentrically arranged with respect to one another, and wherein the primary inductive coil associated with the VCO tuning circuit and the secondary inductive coil associated with the second harmonic filter circuit are magnetically decoupled with respect to one another.

Example 13 is a VCO circuit, including the subject matter of example 12, wherein at least one of the primary inductive coil and the secondary inductive coil is implemented as a magnetically inert coil, in order to magnetically decouple the primary inductive coil and the secondary inductive coil with respect to one another, wherein the magnetically inert coil comprises a coil having a magnetically decoupled structure.

Example 14 is a VCO circuit, including the subject matter of examples 12-13, including or omitting elements, wherein the magnetically inert coil comprises a figure-eight shaped coil.

Example 15 is a VCO circuit, including the subject matter of examples 12-14, including or omitting elements, wherein the magnetically inert coil comprises a clover shaped coil.

Example 16 is a VCO circuit, including the subject matter of examples 12-15, including or omitting elements, wherein the primary inductive coil comprises a regular differential coil and wherein the secondary inductive coil comprises a magnetically inert coil.

Example 17 is a VCO circuit, including the subject matter of examples 12-16, including or omitting elements, wherein the primary inductive coil comprises a magnetically inert coil and wherein the secondary inductive coil comprises a regular differential coil.

Example 18 is a method for a voltage controlled oscillator (VCO) circuit, comprising generating a VCO output signal at a first resonance frequency at a VCO tuning circuit, wherein the VCO tuning circuit comprises a primary inductive coil; and filtering a common mode noise associated with the VCO tuning circuit at a filter circuit coupled to the VCO tuning circuit, wherein the filter circuit comprises a secondary inductive coil and wherein the filter circuit is configured to resonate at a second, different, resonance frequency; wherein the primary inductive coil associated with the VCO tuning circuit and the secondary inductive coil associated with the filter circuit are concentrically arranged with respect to one another, and wherein the primary inductive coil associated with the VCO tuning circuit and the secondary inductive coil associated with the filter circuit are magnetically decoupled with respect to one another.

Example 19 is a method, including the subject matter of example 18, wherein at least one of the primary inductive coil and the secondary inductive coil is implemented as a magnetically inert coil, in order to magnetically decouple the primary inductive coil and the secondary inductive coil with respect to one another, wherein the magnetically inert coil comprises a coil having a magnetically decoupled structure.

Example 20 is a method, including the subject matter of examples 18-19, including or omitting elements, wherein the magnetically inert coil comprises a figure-eight shaped coil.

Example 21 is a method, including the subject matter of examples 18-20, including or omitting elements, wherein the magnetically inert coil comprises a clover shaped coil.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A voltage controlled oscillator (VCO) circuit, comprising:
a VCO tuning circuit comprising a primary inductive coil, wherein the VCO tuning circuit is configured to generate a VCO output signal at a first resonance frequency; and
a filter circuit comprising a secondary inductive coil, wherein the filter circuit is coupled to the VCO tuning circuit and wherein the filter circuit is configured to resonate at a second, different, resonance frequency, in order to filter a noise associated with the VCO tuning circuit;
wherein the primary inductive coil associated with the VCO tuning circuit and the secondary inductive coil associated with the filter circuit are concentrically arranged with respect to one another, and wherein the primary inductive coil associated with the VCO tuning circuit and the secondary inductive coil associated with the filter circuit are magnetically decoupled with respect to one another.

2. The VCO circuit of claim 1, wherein the second resonance frequency comprises a frequency that is twice the first resonance frequency.

3. The VCO circuit of claim 1, wherein the second resonance frequency comprises a frequency that is an integer multiple of the first resonance frequency.

4. The VCO circuit of claim 1, wherein at least one of the primary inductive coil and the secondary inductive coil is implemented as a magnetically inert coil, in order to magnetically decouple the primary inductive coil and the secondary inductive coil with respect to one another, wherein the magnetically inert coil comprises a coil having a magnetically decoupled structure.

5. The VCO circuit of claim 4, wherein the magnetically inert coil comprises a figure-eight shaped coil.

6. The VCO circuit of claim 4, wherein the magnetically inert coil comprises a clover shaped coil.

7. The VCO circuit of claim 4, wherein the primary inductive coil comprises a regular differential coil and wherein the secondary inductive coil comprises a magnetically inert coil.

8. The VCO circuit of claim 4, wherein the primary inductive coil comprises a magnetically inert coil and wherein the secondary inductive coil comprises a regular differential coil.

9. The VCO circuit of claim 4, wherein both the primary inductive coil and the secondary inductive coil comprise magnetically inert coils.

10. The VCO circuit of claim 1, wherein the primary inductive coil and the secondary inductive coil are symmetrically arranged with respect to a common axis that passes through a common center point associated with the primary inductive coil and the secondary inductive coil.

11. The VCO circuit of claim 1, wherein the noise comprises common mode noise.

12. A voltage controlled oscillator (VCO) circuit, comprising:
a VCO tuning circuit comprising a primary inductive coil, wherein the VCO tuning circuit is configured to generate a VCO output signal at a first resonance frequency; and
a second harmonic filter circuit comprising a secondary inductive coil, wherein the second harmonic filter circuit is coupled to the VCO tuning circuit and wherein the second harmonic filter circuit is configured to resonate at a frequency that is a second harmonic of the first resonance frequency, in order to filter a common mode noise associated with the VCO tuning circuit;
wherein the primary inductive coil associated with the VCO tuning circuit and the secondary inductive coil associated with the second harmonic filter circuit are concentrically arranged with respect to one another, and wherein the primary inductive coil associated with the VCO tuning circuit and the secondary inductive coil associated with the second harmonic filter circuit are magnetically decoupled with respect to one another.

13. The VCO circuit of claim 12, wherein at least one of the primary inductive coil and the secondary inductive coil is implemented as a magnetically inert coil, in order to magnetically decouple the primary inductive coil and the secondary inductive coil with respect to one another, wherein the magnetically inert coil comprises a coil having a magnetically decoupled structure.

14. The VCO circuit of claim 13, wherein the magnetically inert coil comprises a figure-eight shaped coil.

15. The VCO circuit of claim 13, wherein the magnetically inert coil comprises a clover shaped coil.

16. The VCO circuit of claim 13, wherein the primary inductive coil comprises a regular differential coil and wherein the secondary inductive coil comprises a magnetically inert coil.

17. The VCO circuit of claim 13, wherein the primary inductive coil comprises a magnetically inert coil and wherein the secondary inductive coil comprises a regular differential coil.

18. A method for a voltage controlled oscillator (VCO) circuit, comprising:
generating a VCO output signal at a first resonance frequency at a VCO tuning circuit, wherein the VCO tuning circuit comprises a primary inductive coil; and
filtering a common mode noise associated with the VCO tuning circuit at a filter circuit coupled to the VCO tuning circuit, wherein the filter circuit comprises a secondary inductive coil and wherein the filter circuit is configured to resonate at a second, different, resonance frequency;

wherein the primary inductive coil associated with the VCO tuning circuit and the secondary inductive coil associated with the filter circuit are concentrically arranged with respect to one another, and wherein the primary inductive coil associated with the VCO tuning circuit and the secondary inductive coil associated with the filter circuit are magnetically decoupled with respect to one another.

19. The VCO circuit of claim 18, wherein at least one of the primary inductive coil and the secondary inductive coil is implemented as a magnetically inert coil, in order to magnetically decouple the primary inductive coil and the secondary inductive coil with respect to one another, wherein the magnetically inert coil comprises a coil having a magnetically decoupled structure.

20. The VCO circuit of claim 19, wherein the magnetically inert coil comprises a figure-eight shaped coil.

21. The VCO circuit of claim 20, wherein the magnetically inert coil comprises a clover shaped coil.

* * * * *